US012689011B2

(12) United States Patent　　　　(10) Patent No.:　US 12,689,011 B2
Lu et al.　　　　　　　　　　　　　(45) Date of Patent:　　　Jul. 21, 2026

(54) APPARATUS WITH HEATED FILTER AND OPERATION METHOD OF THE SAME

(71) Applicant: TAIWAN SEMICONDUCTOR MANUFACTURING COMPANY, LTD., Hsinchu (TW)

(72) Inventors: Chih-Lun Lu, Hsinchu (TW); Chen-Wei Pan, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 370 days.

(21) Appl. No.: 18/364,557

(22) Filed: Aug. 3, 2023

(65) Prior Publication Data

US 2025/0046584 A1　　Feb. 6, 2025

(51) Int. Cl.
　　*H01J 37/32*　　　(2006.01)
　　*B01D 46/42*　　　(2006.01)
　　*C23C 16/44*　　　(2006.01)
　　*C23C 16/50*　　　(2006.01)
　　*H05B 1/02*　　　(2006.01)
　　*H10P 50/24*　　　(2026.01)
　　*H10P 50/26*　　　(2026.01)
　　*H10P 50/28*　　　(2026.01)

(52) U.S. Cl.
　　CPC .... *H01J 37/32844* (2013.01); *B01D 46/4263* (2013.01); *C23C 16/4412* (2013.01); *C23C 16/50* (2013.01); *H01J 37/3244* (2013.01); *H05B 1/023* (2013.01); *B01D 2273/20*

(2013.01); *H10P 50/242* (2026.01); *H10P 50/267* (2026.01); *H10P 50/28* (2026.01)

(58) Field of Classification Search
CPC ............ H01J 37/32844; H01J 37/3244; C23C 16/4412; C23C 16/50; H01L 21/3065; H01L 21/311; H01L 21/32136; B01D 46/4263; B01D 2273/20; H05B 1/023; H10P 50/242; H10P 50/267; H10P 50/28
USPC .......... 118/715, 723, 1; 216/58; 156/345.29, 156/345.48
See application file for complete search history.

(56) References Cited

U.S. PATENT DOCUMENTS

| | | | | |
|---|---|---|---|---|
| 4,608,063 | A * | 8/1986 | Kurokawa ............. | B01D 46/10 |
| | | | | 118/728 |
| 5,278,940 | A * | 1/1994 | Muller ..................... | H05B 3/12 |
| | | | | 123/549 |
| 6,181,874 | B1 * | 1/2001 | Ireland ..................... | H05B 3/82 |
| | | | | 392/398 |
| 2003/0049388 | A1 * | 3/2003 | Cho ....................... | C23C 16/507 |
| | | | | 118/712 |
| 2013/0284288 | A1 * | 10/2013 | Kim ........................ | F16K 51/02 |
| | | | | 137/526 |
| 2021/0339183 | A1 * | 11/2021 | Hourani ............. | B01D 39/2027 |

* cited by examiner

*Primary Examiner* — Rodney G McDonald
(74) *Attorney, Agent, or Firm* — Birch, Stewart, Kolasch & Birch, LLP

(57) ABSTRACT

An apparatus includes a process chamber, a vacuum pump disposed downstream of the process chamber for discharging a fluid flow from the process chamber, a filter mounted between the process chamber and the vacuum pump for filtering the fluid flow, and a heating device disposed to heat the filter.

20 Claims, 5 Drawing Sheets

APPARATUS WITH HEATED FILTER AND OPERATION METHOD OF THE SAME

BACKGROUND

In the manufacturing process of semiconductor devices, various apparatuses are utilized, such as lithographic apparatus, etcher, furnace, implantation apparatus, deposition apparatus, measuring apparatus, etc. During mass production of the semiconductor devices, each apparatus is regularly subjected to preventive maintenance so as to provide a chamber environment with less defect sources. With the continuous miniaturization of the semiconductor devices, the chamber environment in each apparatus is being continuously improved so as to achieve a relatively higher rate of product yield and/or a lower cost for manufacturing the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
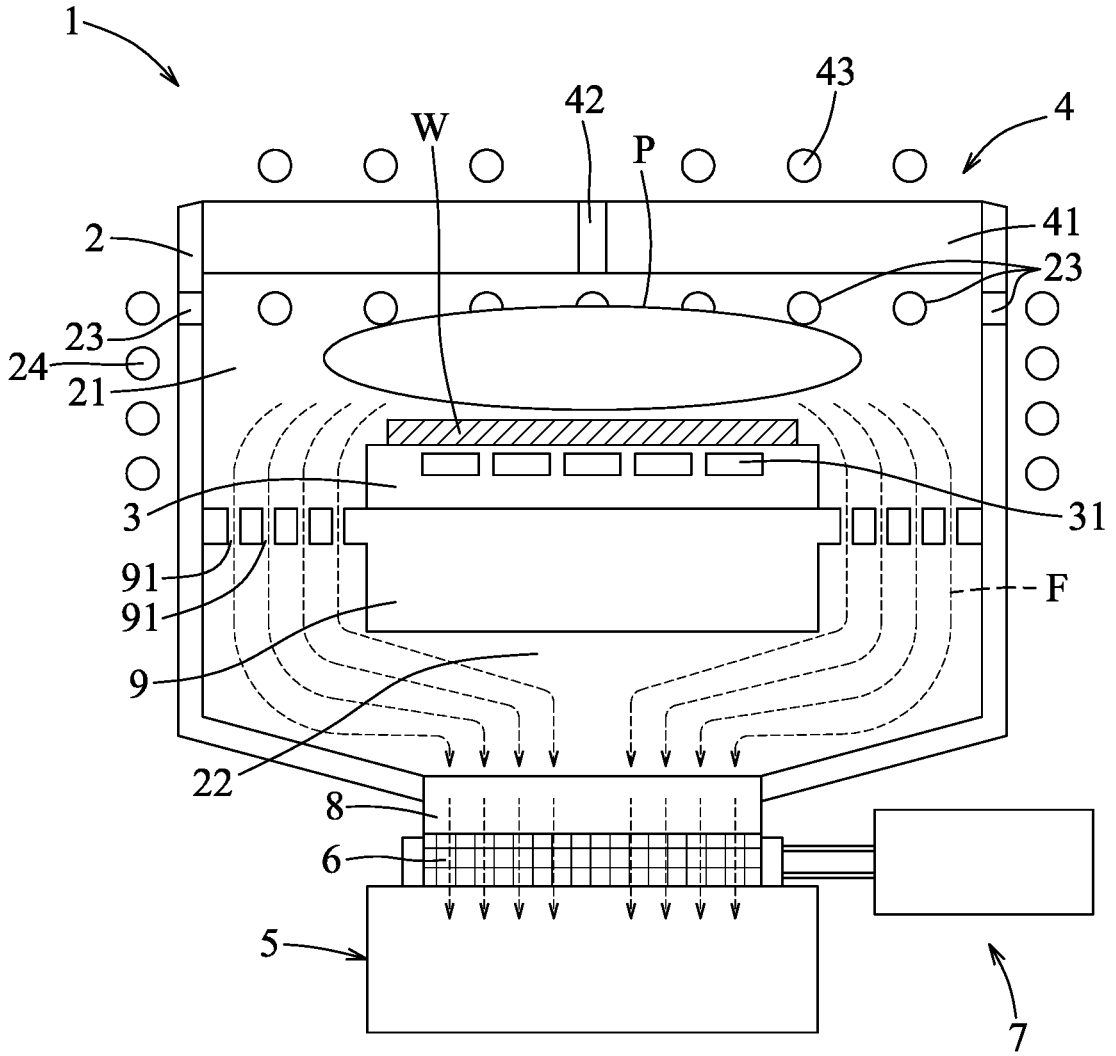
FIG. 1 is a schematic view illustrating an apparatus in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects $\pm 10\%$, in some aspects $\pm 5\%$, in some aspects $\pm 2.5\%$, in some aspects $\pm 1\%$, in some aspects $\pm 0.5\%$, and in some aspects $\pm 0.1\%$ from the specified amount, as such variations are appropriate to perform the disclosed methods or employ the disclosed compositions.

In an apparatus for treating a substrate, a gas evacuation system is often configured downstream of a process chamber to discharge gaseous substances when the substrate is treated in the process chamber. The gaseous substances in the process chamber may include a resultant gas and/or an excess portion of precursor gases, and may have a relatively high temperature. Typically, a filter is used to prevent entrance of particles (which may undesirably generated during treatment of the substrate) entrained in the gaseous substances into the gas evacuation system. Since the gas evacuation system is usually placed at an ambient temperature, the gaseous substances, which have a relatively high temperature, are gradually cooled down and transformed into solid substances (which may contaminate the substrate when distributed in the process chamber) in the pathway toward the gas evacuation system. As such, the gas evacuation system provides a driving force to move the solid substances away from the substrate in the process chamber (for reducing possible defects on the substrate), and the filter (for preventing damages to the gas evacuation system) is provided to collect the solid substances thereon. Replacement of the filter regularly is required in order to effectively remove the solid substances and/or the particles. The frequency for replacement of the filter will affect the cost for treating the substrate.

Therefore, the present disclosure is directed to an apparatus for treating a substrate. The substrate treated with the apparatus can have fewer defects. FIG. 1 is a schematic view illustrating an apparatus 1 in accordance with some embodiments. In some embodiments, the apparatus 1 is used for dry etching the substrate (W). In some embodiments, the apparatus 1 may be a may be a plasma etching device, such as reactive-ion etcher, inductively-coupled plasma reactive-ion etcher, or capacitively-coupled plasma reactive-ion etcher, a plasma deposition device, but is not limited thereto.

The apparatus 1 includes a housing 2, a substrate retainer 3, a plasma generator 4, a vacuum pump 5, a filter 6, and a heating device 7.

The housing 2 includes a process chamber 21 for treating the substrate (W) using a plasma (P). In some embodiments, the substrate (W) may include a base substrate (not shown) and/or one or more materials (not shown) formed on the base substrate. The base substrate be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. In addition, the base substrate may be a bulk silicon substrate, a silicon-on-insulator (SOI) substrate, or a germanium-on-insulator (GOI) substrate. In some embodiments, the material(s) on the base substrate may constitute an epitaxial layer and/or a patterned structure thereon for forming electronic devices (not shown) subsequently. The material(s) to be treated by the plasma may be a semiconductor material, a dielectric material, an electrically conducting material, other suitable materials, or combinations thereof. In some embodiments, the plasma is used for selectively etching selected one(s) of the materials of the substrate (W).

The substrate retainer 3 is disposed in the housing 2 and is configured to retain the substrate (W) in the process chamber 21, so that the substrate (W) can be treated by the plasma (P). In some embodiments, the substrate retainer 3 includes an electrostatic chuck (not shown), but not limited thereto. Other substrate retainers suitable for support or fixation of the substrate (W) are within the contemplated scope of the present disclosure.

The plasma generator 4 is used for generating the plasma (P). In some embodiments, the plasma generator 4 includes a dielectric plate 41, a first gas inlet 42 and a plasma coil 43. The dielectric plate 41 is disposed above the substrate retainer 3. The first gas inlet 42 is formed in the dielectric plate 41 and configured to introduce a first precursor gas into the process chamber 21. In some embodiments, the plasma coil 43 is a transformer-coupled plasma coil. The plasma coil 43 is disposed above the dielectric plate 41 to ionize the first precursor gas in the process chamber 21 so as to generate the plasma (P) in the process chamber 21 when a power is applied to the plasma coil 43. In some embodiments, the first precursor gas may include a halogen-containing gas, an inert gas (or a carrier gas), or a combination thereof. The halogen-containing gas is provided to react with the material(s) of the substrate (W) so as to form volatile reactants. In some embodiments, the halogen-containing gas may include hydrogen fluoride (HF), nitrogen fluoride ($NF_x$), carbon fluoride ($CF_x$), sulfur fluoride ($SF_x$), other suitable gases, or combinations thereof. The inert gas is provided to adjust the concentration of the halogen-containing gas in the process chamber 21. In some embodiments, the inert gas may include helium, argon, and a combination thereof. In some embodiments, helium and/or argon may be also used to bombard the surface of the substrate (W) in the case that a power is applied to the substrate retainer 3. In order to increase an etching selectivity of a material relative to other materials, the first precursor gas may further include a carbon-containing gas. The carbon-containing gas is provided to adjust a ratio of fluorine to carbon in the plasma (P), thereby increasing the etching selectivity. That is, a surface portion of the substrate (W) may have an etching rate higher than that of another surface portion of the substrate (W). The surface portions may be made of different materials, or the surface portions may include the same material species but have different atomic compositions. In some embodiments, the carbon-containing gas may include non-substituted hydrocarbon gas (e.g., methane ($CH_4$)), a halogen substituted hydrocarbon gas (e.g., fluoromethane ($CH_3F$), trifluoromethane ($CHF_3$)), other suitable carbon-containing gases, or combinations thereof. In view of the presence of the carbon-containing gas, polymer-like byproducts (such as hydrocarbon monomers, hydrocarbon polymers, halocarbon monomers, halocarbon polymers (e.g., fluorocarbon polymers), other suitable monomers and/or polymers, or combinations thereof) may be formed during the etching process. Since the process chamber 21 is kept at a plasma treating temperature (which is a relatively higher temperature), such byproducts may be kept in a gaseous form at least on the substrate (W). In some cases, when parts of an inner surface of the housing 21 have a temperature lower than that of the substrate (W), such byproducts may be transformed into a solid form and then observed on the inner surface of the housing 21. In some embodiments, a plurality of heating elements 31 may be disposed inside the substrate retainer 3 and/or inside the process chamber 21. In some embodiments, a heating coil 24 may be provided to heat the process chamber 21. In some embodiments, the heating coil 24 is disposed to surround a part of the housing 2 for heating the process chamber 21. As such, a temperature of the substrate (W) can be kept at or very close to the plasma treating temperature. In some embodiments, the plasma generator 4 further includes a plurality of second gas inlets 23 formed in the housing 2. The second gas inlets 23 are angularly spaced apart from each other so as to introduce a second precursor gas into the process chamber 21 through the second gas inlets 23. Therefore, the second precursor gas is permitted to be ionized, together with the first precursor gas, to generate the plasma (P). Possible gases for the second precursor gas are similar to the first precursor gas, and details thereof are omitted for the sake of brevity. In some embodiments, at least one of the first and second precursor gases includes the hydrocarbon gas. In some embodiments, both the first and second precursor gases include the hydrocarbon gas. In some embodiments, the first and second precursor gases may be the same or different from each other.

The vacuum pump 5 is disposed downstream of the process chamber 21 for discharging a fluid flow (F) from the process chamber 21. In some embodiments, the fluid flow (F) may contain products resulted from the plasma etching, the byproducts, non-reacted first and second precursor gases, and the inert gas. By the driving force provided by the vacuum pump 5, the solid byproducts on the inner surface of the housing 2 may also be entrained in the fluid flow (F), and thus the byproducts in the fluid flow (F) may be in both the gaseous form and the solid form. The filter 6 is mounted between the process chamber 21 and the vacuum pump 5 for filtering the fluid flow (F). In some embodiments, in addition to the particles (undesirably generated during treatment of the substrate (W)), the solid byproducts may be also filtered out by the filler 6 so as to prevent the vacuum pump 5 from being adversely affected by solids engrained in the fluid flow (F). In some embodiments, the filter 6 is a mesh filter. The heating device 7 is disposed to heat the mesh filter 6 so as to increase a gas percentage in the fluid flow (F) when the fluid flow (F) passes through the mesh filter 6. In the case that the mesh filter 6 is not heated, since the mesh filter 6 is located downstream of the process chamber 21 and has a temperature much lower than the plasma treating temperature, the byproducts in the fluid flow (F) have a relatively higher percentage of the solid byproducts, and thus a service life of the mesh filter 6 may be relatively short. By heating the mesh filter 6 to above a predetermined temperature which is closer to the plasma treating temperature, the gas percentage in the fluid flow (F), when the fluid flow (F) passes through the mesh filter 6, can be greatly increased, and the service life of the mesh filter 6 can thus prolonged, thereby reducing the cost for treating the substrate (W).

In some embodiments, the apparatus 1 further includes a throttle valve 8 coupled to an outlet of the housing 2 and disposed downstream of the process chamber 21 for regulating a flow rate of the fluid flow (F) entering the vacuum pump 5.

Figures 2, 3:
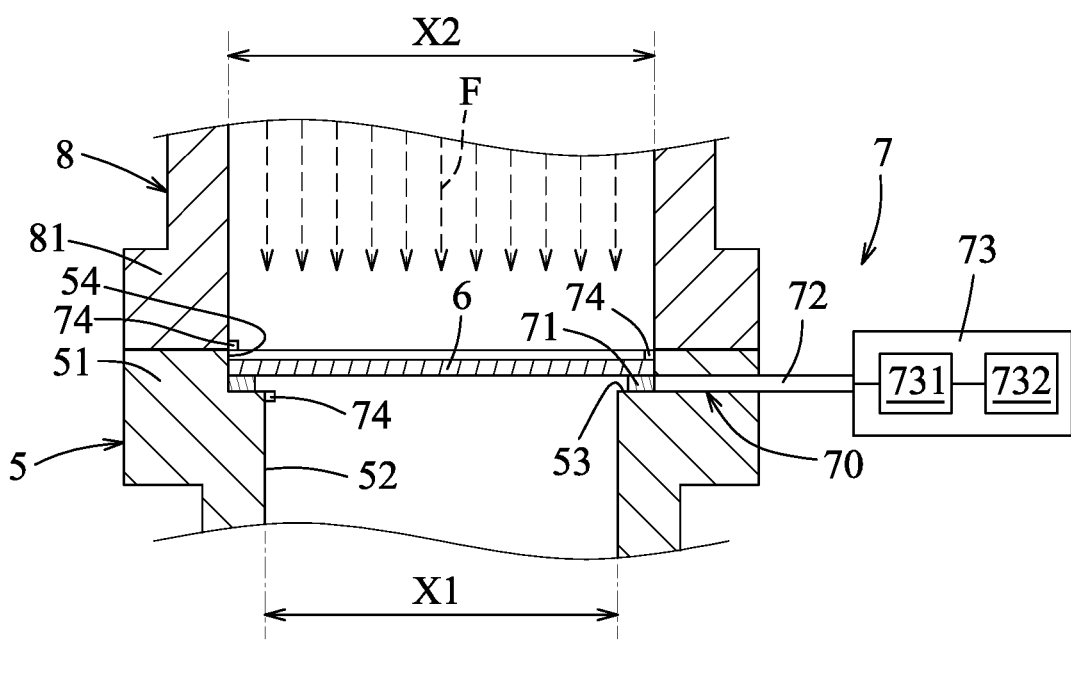
FIG. 2 is an enlarged, fragmentary sectional view of a vacuum pump, a mesh filter, a heating device, and a throttle valve of the apparatus in accordance with some embodiments.
FIG. 3 is an exploded perspective view illustrating the mesh filter and the heating device shown in FIG. 2 in accordance with some embodiments.

FIG. 2 is an enlarged, fragmentary sectional view of the vacuum pump 5, the mesh filter 6, the heating device 7, and the throttle valve 8 in accordance with some embodiments. FIG. 3 is an exploded perspective view illustrating the mesh filter 6 and the heating device 7 in accordance with some embodiments. As shown in FIG. 2, an end face of an outlet tube 81 of the throttle valve 8 is in abutting engagement with an end face of an inlet tube 51 of the vacuum pump 5, and thus an outlet of the throttle valve 8 (surrounded by the outlet tube 81) is fluidly connected to an inlet of the vacuum pump 5 (surrounded by the inlet tube 51). An inner surface of the inlet tube 51 has a first portion 52, a second portion 54, and a shoulder portion 53. The second portion 54 is located upstream of the first portion 52. The inlet tube 51 has a first inner dimension (X1) at the first portion 52 and a second inner dimension (X2) at the second portion 54. The second inner dimension (X2) is larger than the first inner dimension (X1). The shoulder portion 53 interconnects the first and second portions 52, 54 and is configured to permit the mesh filter 6 to be disposed thereon. In some embodiments, the mesh filter 6 may have a circular shape (see FIG. 3) and have a diameter ranging from about 25 cm to about 45 cm. Thus, the shoulder portion 53 may be in an annular shape to support a peripheral region of the circular mesh filter 6. In some embodiments, the mesh filter 6 may be made of aluminum-magnesium alloy, but not limited thereto. Other suitable materials for the mesh filter 6 are within the contemplated scope of the present disclosure. In some embodiments, the vacuum pump 5 includes a turbo molecular pump, but not limited thereto. Other vacuum pumps 5 suitable for discharging the fluid flow are within the contemplated scope of the present disclosure.

As shown in FIGS. 2 and 3, the heating device 7 includes a conduction unit 70, a heat generator 73, and one or more temperature sensors 74.

The temperature sensor(s) 74 are provided for detecting a temperature of the mesh filter 6. In some embodiments, as shown in FIG. 2, the temperature sensor(s) 74 may be disposed (i) on an inner surface of the outlet tube 81 or on the second portion 54 proximate to the mesh filter 6, (ii) in contact with the mesh filter 6, and/or (iii) on the first portion 52 proximate to the mesh filter 6.

The heat generator 73 is configured to directly or indirectly convert electrical energy to heat energy, and is in signal communication with the temperature sensor(s) 74 in a wired or wireless manner. The conduction unit 70 is provided to transmit the heat energy from the heat generator 73 to the mesh filter 6. In some embodiments, the heat generator 73 includes an electrical resistor 731 and a controller 732. The electrical resistor 731 is switchable between an on-state and an off-state by the controller 732, and is in thermal contact with the conduction unit 70 for transmitting heat energy generated from the electrical resistor 731 to the conduction unit 70. The controller 732 is in signal communication with the temperature sensor(s) 74 and the electrical resistor 731 in a wired or wireless manner. When the heat generator 73 is actuated, the controller 732 functions by switching the electrical resistor 731 between the on-state and off-state based on signal(s) from the temperature sensor(s) 74. When the electrical resistor 731 is switched to the on-state, electrical energy (i.e., current) is applied to the electrical resistor 731 to convert the electrical energy into the heat energy. When the electrical resistor 731 is switched to the off-state, the electrical energy is not applied to the electrical resistor 731. When the signal(s) from the temperature sensor(s) 74 reveal that the temperature of the mesh filter 6 is higher than the predetermined temperature, the controller 732 will switch the electrical resistor 731 to the off-state; and when the signal(s) from the temperature sensor(s) 74 reveal that the temperature of the mesh filter 6 is lower than the predetermined temperature, the controller 732 will switch the electrical resistor 731 to the on-state. As such, the mesh filter 6 can be kept at a temperature that is at least above the predetermined temperature. Other configurations suitable for the heat generator 73 are within the contemplated scope of the present disclosure.

Figure 6:
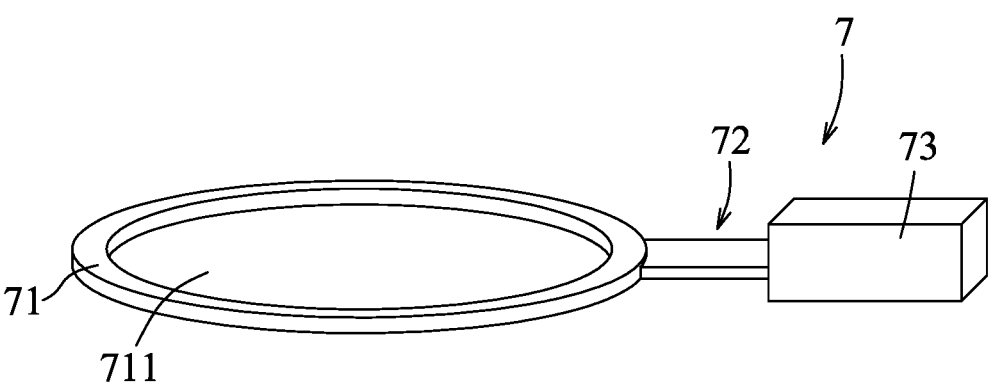
FIG. 6 is a schematic view illustrating the heating device in accordance with some other embodiments.

In some embodiments, the heat generator 73 is disposed outside a pathway of the fluid flow (F) (e.g., outside of the vacuum pump 5), and the conduction unit 70 includes a conduction base 71 and a conduction rod 72. The conduction base 71 is configured to support the mesh filter 6 on the shoulder portion 53. The conduction rod 72 extends through the inlet tube 51 so as to bring the conduction base 71 into thermal contact with the electrical resistor 731 of the heat generator 73, thereby transmitting the heat energy from the heat generator 73 to the mesh filter 6 through the conduction unit 70. In some embodiments, as shown in FIG. 3, the conduction unit 70 may include two or more of the conduction rods 72 for transmitting the heat energy to different parts of the conduction base 71. In some other embodiments, the conduction unit 70 may include a single conduction rod 72, as shown in FIG. 6. The conduction base 71 and the conduction rod(s) 72 may include a high thermal conductivity material. Possible materials for each of the conduction base 71 and the conduction rod(s) 72 may include an elemental metal (for example, but not limited to, copper, aluminum, or silver), an alloy (for example, but not limited to, the alloy including copper, aluminum, silver, or combinations thereof), a ceramic material (for example, but not limited to, boron nitride, aluminum nitride, aluminum nitride, silicon carbide, or combinations thereof), a carbon material (for example, but not limited to, nature or synthetic diamond, graphene, graphite, or carbon fiber), a thermal conductivity polymer (for example, but not limited to, polyethylene or polypropylene), or combinations thereof. Other high thermal conductivity materials suitable for the conduction base 71 and the conduction rod(s) 72 are within the contemplated scope of the present disclosure. In some embodiments, the material of each of the conduction base 71 and the conduction rod(s) 72 may a thermal conductivity greater than about 20 $Wm^{-1}K^{-1}$, about 200 $Wm^{-1}K^{-1}$, about 300 $Wm^{-1}K^{-1}$, about 400 $Wm^{-1}K^{-1}$, about 1000 $Wm^{-1}K^{-1}$ or about 2000 $Wm^{-1}K^{-1}$. In some embodiments, the material of each of the conduction base 71 and the conduction rod(s) 72 has an electric resistance ranging from about $10^{-8}$ $\Omega m$ to about $10^{-7}$ $\Omega m$, from about $10^{-7}$ $\Omega m$ to about $10^{-6}$ $\Omega m$, from about $10^{-6}$ $\Omega m$ to about $10^{-5}$ $\Omega m$, or from about $10^{-5}$ Ωm to about $10^{-4}$ Ωm. The conduction base 71 may be made of a material the same as or different from that of the conduction rod(s) 72.

Figure 4:
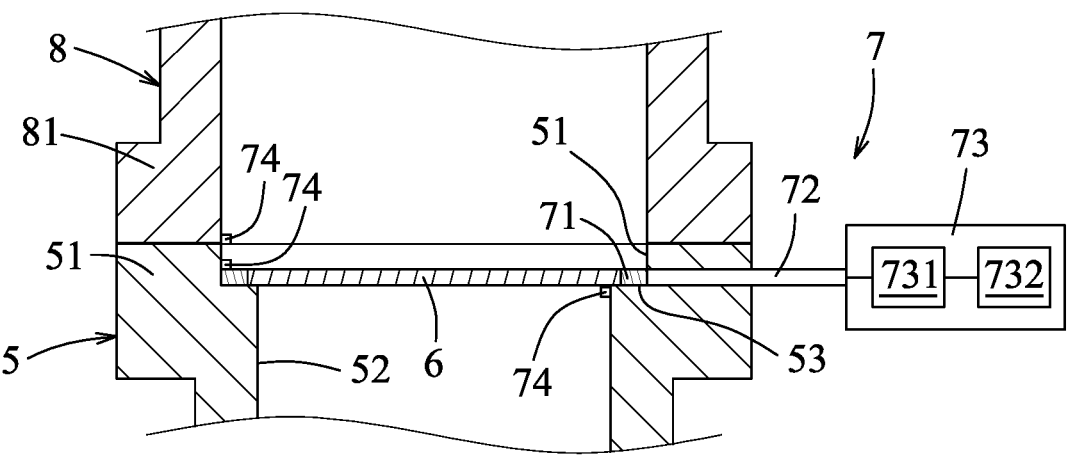
FIG. 4 is an enlarged, fragmentary sectional view similar to that shown in FIG. 2, but illustrating some other modified embodiment.
Figure 5:
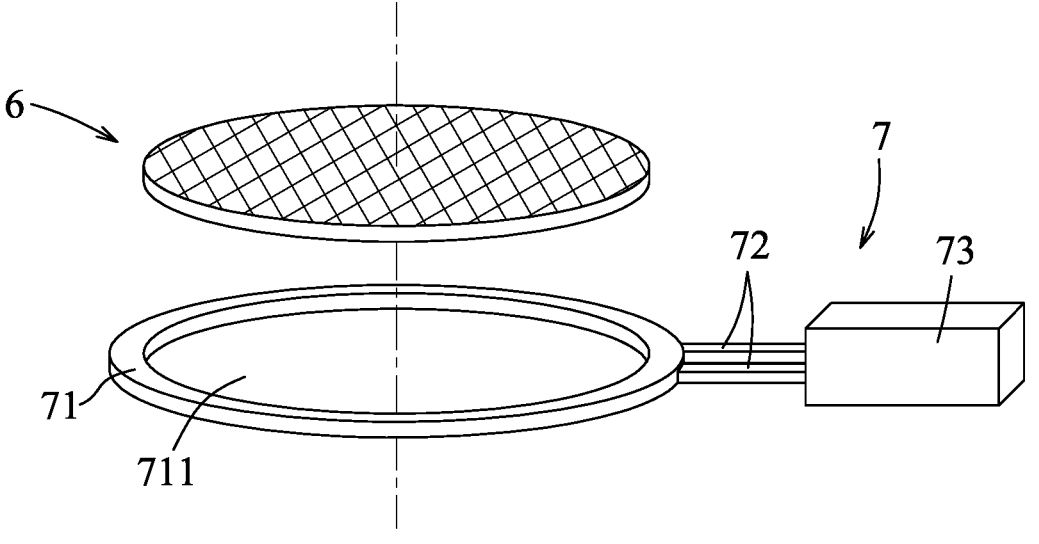
FIG. 5 is an exploded perspective view illustrating the mesh filter and the heating device shown in FIG. 4 in accordance with some embodiments.

The conduction base 71 is in direct contact with the mesh filter 6. In some embodiments, the conduction base 71 is disposed downstream of the mesh filter 6. In some embodiments, the conduction base 71 is mounted beneath and extends along a periphery of the mesh filter 6 to form an opening 711 for passage of the fluid flow (F). Thus, the mesh filter 6 can be uniformly heated through the conduction base 71. In some embodiments, the conduction unit 71 is disposed on the shoulder portion 53 and sandwiched between the shoulder portion 53 and the mesh filter 6. In some embodiments, the conduction base 71 is in a form of a ring. In some embodiments, an inner dimension of the conduction base 71 is smaller than an outer dimension of the mesh filter 6, and an outer dimension of the conduction base 71 is larger than the first inner dimension (X1), so that the mesh filter 6 can be disposed on the conduction base 71. In some embodiment, at least one of the conduction base 71 and the mesh filter 6 is in fitting engagement with the second portion 54 of the inner surface of the inlet tube 51. In some embodiments, the outer dimension of the conduction base 71 is substantially the same as that of the mesh filter 6. In some embodiments, a distance D1 between an outer periphery and an inner periphery of the conduction base 71 ranges from about 0.5 cm to about 3.0 cm. FIGS. 4 and 5 are views respectively similar to FIGS. 2 and 3, but illustrating another positional relationship between the conduction base 71 and the mesh filter 6 in accordance with some modified embodiments. In this case, the mesh filter 6 is fittingly engaged in the opening 711 of the conduction base 71. Other configurations suitable for the conduction unit 70 are within the contemplated scope of the present disclosure.

In some embodiments, the housing 2 further includes a communication chamber 22 disposed downstream of the process chamber 21 and upstream of the mesh filter 6. In some embodiments, the apparatus 1 further includes a supporting frame 9 which is configured to support the substrate retainer 3, and which is disposed inside the housing 2 to partition an inner space of the housing 2 into the process chamber 21 and the communication chamber 22. The supporting frame 9 is formed with a plurality of venting bores 91 for passage of the fluid flow (F). Since the heating elements 31 and the heating coil 24 are disposed in positions spaced apart from the communication chamber 22, the solid byproducts may be also observed in the communication chamber 22.

In some alternative embodiments, the apparatus 1 may further include additional features, and/or some features present in the apparatus 1 may be modified, replaced, or eliminated without departure from the spirit and scope of the present disclosure. For example, in some embodiments not shown herein, the apparatus after appropriate modification may be used for depositing films on the substrate. For example, the apparatus after appropriate modification may be used for a plasma enhanced chemical vapor deposition. Likewise, the mesh filter 6 may be applied to other apparatus including a vacuum pump.

Figure 7:
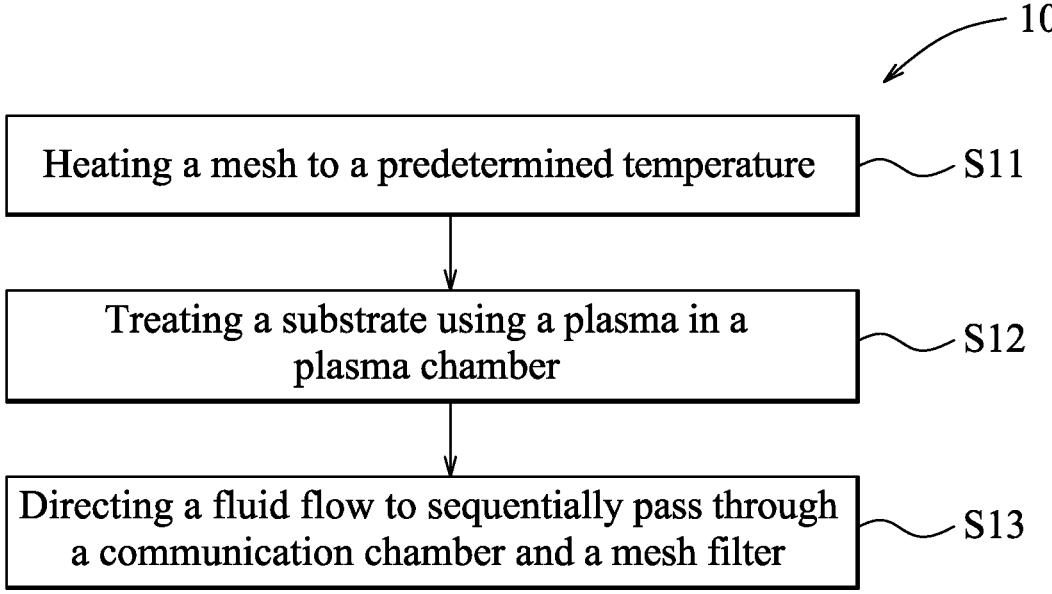
FIG. 7 is a flow diagram illustrating a method in accordance with some embodiments.
Figure 8:
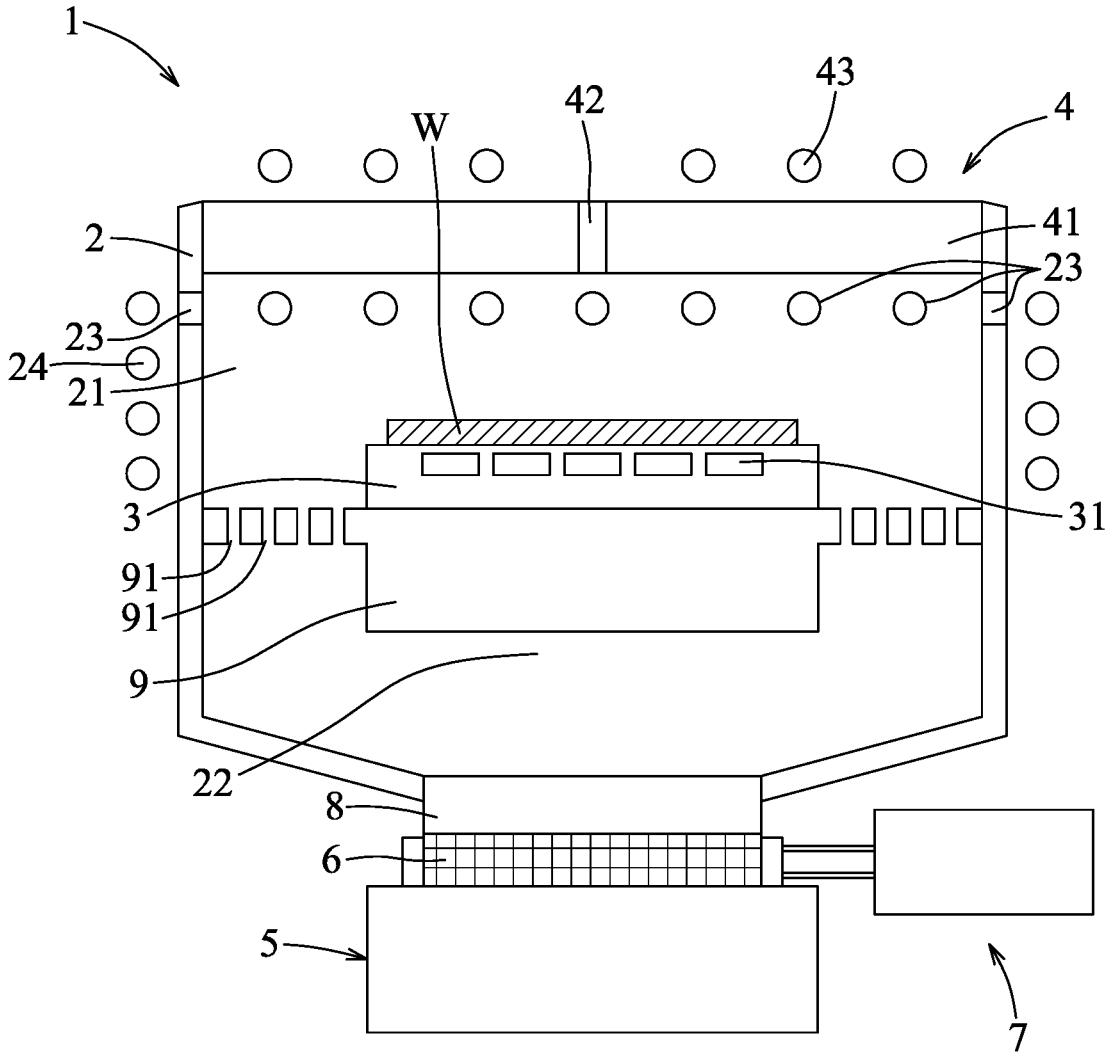
FIG. 8 is a schematic view is similar to that shown in FIG. 1, but illustrating a stage of the apparatus, where a plasma generator is not actuated in accordance with some embodiments.

FIG. 7 is a flow diagram illustrating a method 10 in accordance with some embodiments. FIG. 8 is a schematic view similar to FIG. 1 but illustrating a stage of the apparatus, where the plasma generator 4 is not actuated, in accordance with some embodiments. Similar numerals from the above-mentioned embodiments are used where appropriate. In some embodiments, the method 10 includes steps S11 to S13.

Referring to FIGS. 7 and 8, the method 10 begins at step S11, where, prior to actuating the plasma generator 4, the heating device 7 is actuated to heat the mesh filter 6 from the ambient temperature to the predetermined temperature. Determination of the predetermined temperature will be described later in the disclosure. The temperature detected by the temperature sensor(s) 74 (see also FIG. 2) may be the same as the ambient temperature before actuating the heating device 7, and may be similar, close, or greater than the predetermined temperature after step S11.

In some embodiments, the method 10 may further include a step of placing the substrate (W) on the substrate retainer 3 and a step of elevating a temperature of the process chamber 21 to the plasma treating temperature (using the heating elements 31 and/or the heating coil 24). In some embodiments, placing the substrate (W) may be performed before or after actuating the heating device 7 for heating the mesh filter 6. In some embodiments, the above two steps and step S11 may be performed at the same time. Once the temperature detected by the temperature sensor(s) 74 reaches the predetermined temperature, and the substrate (W) and the process chamber 21 are heated to the plasma treating temperature, the method 10 may proceed to the next step.

Referring to FIGS. 7 and 1, the method 10 proceeds to step S12, where the plasma generator 4 is actuated to permit the substrate (W) to be treated by the plasma (P) in the plasma chamber 21 at the plasma treating temperature.

In some embodiments, selected one(s) of the materials of the substrate (W) may be etched using the plasma (P). The plasma treating temperature may range from about 70° C. to about 400° C.

In step S12, the first and second precursor gases for generating the plasma (P) are respectively introduced through the first and second gas inlets 42, 23 into the process chamber 21, and are ionized to generate the plasma (P) by the plasma generator 4 when a power is applied to the plasma coil 43. The first and second precursor gases are described above and thus are not described for sake of brevity.

Since the temperature (i.e., the plasma treating temperature) inside the process chamber 21 is relatively high, the polymer-like byproducts, generated in the plasma treatment, may be present as the gaseous form.

Referring to FIG. 7, the method 10 proceeds to step S13, where the vacuum pump 5 is actuated to direct the fluid flow (W) to sequentially pass through the communication chamber 22 and the mesh filter 6. In some embodiments, the vacuum pump 5 is actuated in step 13 for directing the fluid flow (W) to flow away from the process chamber 21 after step 12 is finished, as illustrated in FIG. 7. In some other embodiments, the vacuum pump 5 may be actuated before step S12, and thus, once the plasma is generated to treat the substrate (W), the fluid flow (F) including the products resulting from the plasma etching, the byproducts, non-reacted first precursor gas, the carrier gas can be readily and continuously drawn out of the housing 2 through the driving force from the vacuum pump 5.

Since the communication chamber 22 is used for communicating the process chamber 21 with the vacuum pump 5, the fluid flow (F) leaving the processing chamber 21 and heading into the communication chamber 22 may have a relatively lower temperature (i.e., a cooled down temperature that is lower than the plasma treating temperature). As such, the gaseous byproducts contained in the fluid flow (F) may be transformed into the solid byproducts which may entrained in the fluid flow (F) or deposited on the inner surface of the housing 2 at the communication chamber 22. The solid byproducts on the inner surface of the housing 2 may be detached from the housing 2 and also be entrained in the fluid flow (F) for a period of time.

When the fluid flow (F) reaches and is heated by the mesh filter 6, solid portions (including the polymer-like byproducts and the particles undesirably generated in step 12) in the fluid flow (F), especially the polymer-like byproducts, are likely to transform back to the gaseous form. As such, gas portions (including the gaseous byproducts transformed from the solid byproducts) pass through the mesh filter 6, and the solid byproducts (which are not transformed back to the gaseous form) and the particles are collected on the mesh filter 6. Evidently, the predetermined temperature can be determined by a transformation temperature of the solid byproducts from the gaseous byproducts (i.e., the deposition temperature of the gaseous byproducts). Therefore, the amount of solid byproducts collected by the mesh filter 6 may be very low, thereby prolonging the service life of the mesh filter 6. The predetermined temperature may vary according to species and compositions of the hydrocarbon gas used in the first and second precursor gases. In some embodiments, the predetermined temperature may range from about 100° C. to about 250° C., but other ranges of values are also within the scope of this disclosure. For example, in some embodiments, the predetermined temperature may be also greater than about 250° C.

In some embodiments, after completion of the etching process, the introduction of the first and second precursor gases into the process chamber 21, the heating of the substrate (W) and the heating of the process chamber 21 are ceased, and thus the temperature inside the process chamber 21 is gradually cooled down to the ambient temperature. Thereafter, the treated substrate (W) is removed from the process chamber 21. In some embodiments, the vacuum pump 5 is continuously operated unless the apparatus 1 is scheduled for routine maintenance. The heating of the mesh filter 6 may be terminated after the vacuum pump 5 is shut down.

In some embodiments, some steps in the method 10 may be modified, replaced, or eliminated without departure from the spirit and scope of the present disclosure.

In this disclosure, by heating the mesh filter to a predetermined temperature which is closer to a processing temperature (i.e., the plasma treating temperature) in the apparatus, a gas percentage in the fluid flow passing through the heated mesh filter is significantly increased. As such, the amount of the particles and/or the solid byproducts collected by the mesh filter for each treatment in the apparatus is relatively low, and the service life of the mesh filter can be significantly prolonged, so that the frequency of the replacement of the mesh filter can be greatly reduced. In addition to reduction of cost for maintenance of the apparatus, the semiconductor devices manufactured using the apparatus may have less defects due to the particles and/or the solid byproducts being present on the apparatus in less amount, thereby improving reliability and yield of the semiconductor devices.

In accordance with some embodiments of the present disclosure, An apparatus includes a process chamber, a vacuum pump disposed downstream of the process chamber for discharging a fluid flow from the process chamber, a filter mounted between the process chamber and the vacuum pump for filtering the fluid flow, and a heating device disposed to heat the filter.

In accordance with some embodiments of the present disclosure, the filter is a mesh filter.

In accordance with some embodiments of the present disclosure, the heating device includes a heat generator for generating a heat energy, and a conduction unit configured to transmit the heat energy from the heat generator to the filter.

In accordance with some embodiments of the present disclosure, the conduction unit includes a conduction base which has an opening for passage of the fluid flow, and which is disposed downstream of the filter.

In accordance with some embodiments of the present disclosure, an outer dimension of the filter ranges from 25 cm to 45 cm, and a distance between an outer periphery and an inner periphery of the conduction base ranges from 0.5 cm to 3.0 cm.

In accordance with some embodiments of the present disclosure, the conduction unit includes a conduction base which has an opening for passage of the fluid flow. The filter is fittingly engaged in the opening of the conduction base.

In accordance with some embodiments of the present disclosure, the heating device further includes a temperature sensor disposed for detecting a temperature of the filter.

In accordance with some embodiments of the present disclosure, the heat generator further includes an electrical resistor and a controller. The electrical resistor serves for converting an electrical energy to the heat energy, and is in thermal contact with the conduction unit. The controller is in single communication with the temperature sensor and the electrical resistor, and is configured such that when the temperature of the filter is lower than a predetermined temperature, the electrical resistor is switched by the controller from an off-state to an on-state, where the electrical energy is applied to the electrical resistor.

In accordance with some embodiments of the present disclosure, an apparatus includes a housing including a process chamber for treating a substrate using a plasma, a first precursor gas introduced into the process chamber for generating the plasma, a substrate retainer disposed in the housing and configured to retain the substrate in the process chamber, so as to permit the substrate to be treated by the plasma, a vacuum pump disposed downstream of the housing for discharging a fluid flow which results from treating the substrate using the plasma, a mesh filter mounted between the housing and the vacuum pump for filtering the fluid flow, and a heating device disposed to heat the mesh filter.

In accordance with some embodiments of the present disclosure, the apparatus further includes a plasma generator for generating the plasma. The plasma generator includes a dielectric plate disposed above the substrate retainer, a first gas inlet formed in the dielectric plate and configured to introduce the first precursor gas into the process chamber, and a plasma coil disposed above the dielectric plate so as to ionize the first precursor gas to generate the plasma in the process chamber when a power is applied to the plasma coil.

In accordance with some embodiments of the present disclosure, the apparatus further includes a second precursor gas, and a plurality of second gas inlets which are formed in the housing, and which are angularly spaced apart from each other so as to introduce the second precursor gas into the process chamber through the second gas inlets, and so as to permit the second precursor gas, together with the first precursor gas, to be ionized to generate the plasma.

In accordance with some embodiments of the present disclosure, at least one of the first precursor gas and the second precursor gas includes a hydrocarbon gas.

In accordance with some embodiments of the present disclosure, the heating device includes a heat generator for generating a heat energy, and a conduction unit configured to transmit the heat energy from the heat generator to the mesh filter.

In accordance with some embodiments of the present disclosure, the apparatus further includes a throttle valve coupled between the housing and the mesh filter.

In accordance with some embodiments of the present disclosure, the housing further includes a communication chamber disposed downstream of the process chamber and upstream of the mesh filter.

In accordance with some embodiments of the present disclosure, the apparatus further includes a supporting frame which is configured to support the substrate retainer, and which is disposed inside the housing to partition an inner space of the housing into the process chamber and the communication chamber. The supporting frame is formed with a plurality of venting bores so as to permit passage of the fluid flow.

In accordance with some embodiments of the present disclosure, a method includes: treating a substrate using a plasma in a plasma chamber at a plasma treating temperature so that a fluid flow which results from treating the substrate is obtained; directing the fluid flow to sequentially pass through a communication chamber and a mesh filter, the fluid flow in the communication chamber having a cooled down temperature lower than the plasma treating temperature; and heating the mesh filter to a predetermined temperature which is higher than the cooled down temperature so as to increase a gas percentage of the fluid flow when the fluid flow passes through the mesh filter.

In accordance with some embodiments of the present disclosure, the mesh filter is heated through a thermal conductor which is in direct contact with the mesh filter, and which transmits a heat energy from a heat generator to the mesh filter.

In accordance with some embodiments of the present disclosure, the plasma is generated by ionization of a precursor gas which includes a hydrocarbon gas.

In accordance with some embodiments of the present disclosure, the mesh filter is heated to the predetermined temperature before treating the substrate using the plasma.

In accordance with some embodiments of the present disclosure, an apparatus includes a housing, a vacuum pump, a filter, and a heating device. The housing includes a process chamber. The vacuum pump is disposed downstream of the process chamber for discharging a fluid flow from the process chamber. The vacuum pump includes an inlet tube. An inner surface of the inlet tube has a first portion, a second portion located upstream of the first portion, and a shoulder portion interconnecting the first portion and the second portion. The inlet tube has a first inner dimension at the first portion, and a second inner dimension at the second portion. The second inner dimension is larger than the first inner dimension. The filter is disposed on the shoulder portion for filtering the fluid flow. The heating device is disposed to heat the filter.

In accordance with some embodiments of the present disclosure, the heating device includes a heat generator for generating a heat energy, the heat generator being disposed outside a pathway of the fluid flow, a conduction base disposed in contact with the filter, and a conduction rod extending through the inlet tube so as to bring the conduction base into thermal contact with the heat generator, and so as to transmit the heat energy from the heat generator to the filter through the conduction base and the conduction rod.

In accordance with some embodiments of the present disclosure, the conduction base has an opening for passage of the fluid flow.

In accordance with some embodiments of the present disclosure, the apparatus further includes a throttle valve for regulating a flow rate of the fluid flow entering the vacuum pump. An end face of an outlet tube of the throttle valve being in abutting engagement with an end face of the inlet tube of the vacuum pump.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a housing including a process chamber for etching a substrate using a plasma;
a substrate retainer disposed in the housing and configured to retain the substrate in the process chamber, so as to permit the substrate to be etched by the plasma;
a vacuum pump disposed downstream of the housing for discharging a fluid flow which results from etching the substrate using the plasma;
an engagement wall defining a passageway downstream of the housing and upstream of the vacuum pump;
a mesh filter which is configured to filter fluid flow, and which is connected to an inner surface of the engagement wall; and
a heating device disposed to heat the mesh filter, the heating device including
a heat generator for generating a heat energy, the heat generator being located outside of the engagement wall, and
a conduction unit which extends from the heat generator through the engagement wall into the passageway and which is connected to the mesh filter so as to bring the mesh filter into thermal contact with the heat generator.

2. The apparatus as claimed in claim 1, further comprising a plasma generator for generating the plasma, the plasma generator including
a dielectric plate disposed above the substrate retainer,
a first gas inlet formed in the dielectric plate and configured to introduce a first precursor gas for generating the plasma into the process chamber, and
a plasma coil disposed above the dielectric plate so as to ionize the first precursor gas to generate the plasma in the process chamber when a power is applied to the plasma coil.

3. The apparatus as claimed in claim 2, further comprising:
a plurality of second gas inlets which are formed in the housing, and which are angularly spaced apart from each other so as to introduce a second precursor gas into the process chamber through the second gas inlets, and so as to permit the second precursor gas, together with the first precursor gas, to be ionized to generate the plasma.

4. The apparatus as claimed in claim 1, further comprising a throttle valve coupled between the housing and the mesh filter.

5. The apparatus as claimed in claim 1, wherein the housing further includes a communication chamber disposed downstream of the process chamber and upstream of the mesh filter.

6. The apparatus as claimed in claim 5, further comprising a supporting frame which is configured to support the substrate retainer, and which is disposed inside the housing to partition an inner space of the housing into the process chamber and the communication chamber, the supporting frame being formed with a plurality of venting bores so as to permit passage of the fluid flow.

7. The apparatus as claimed in claim 1, wherein the conduction unit has a thermal conductivity greater than 20 $Wm^{-1}K^{-1}$, and the conduction unit includes a conduction base which has an opening for passage of the fluid flow, and which is disposed in the passageway downstream of the mesh filter, and a conduction rod which extends from the heat generator through the engagement wall to the conduction base in the passageway so as to bring the conduction base into thermal contact with the heat generator.

8. The apparatus as claimed in claim 7, wherein an outer periphery of each of the conduction base and the mesh filter is in fitting engagement with the inner surface of the engagement wall.

9. The apparatus as claimed in claim 1, wherein the conduction unit includes:

a conduction base which has an inner periphery defining an opening for passage of the fluid flow, the inner periphery being configured to receive and retain the mesh filter in the opening, and an outer periphery configured to be retained by the engagement wall; and a conduction rod which extends from the heat generator through the engagement wall to the conduction base in the passageway so as to bring the conduction base into thermal contact with the heat generator.

10. The apparatus as claimed in claim 1, wherein the inner surface of the engagement wall has a first portion defining a first inner dimension of the passageway, a second portion located upstream of the first portion, and defining a second inner dimension of the passageway, the second inner dimension being greater than the first inner dimension, and a shoulder portion interconnecting the first portion and the second portion, the mesh filter being disposed on the shoulder portion.

11. The apparatus as claimed in claim 1, wherein the heating device further includes a temperature sensor disposed for detecting a temperature of the mesh filter.

12. The apparatus as claimed in claim 11, wherein the heat generator further includes an electrical resistor for converting an electrical energy to the heat energy, the electrical resistor being in thermal contact with the conduction unit, and a controller which is in single communication with the temperature sensor and the electrical resistor, and which is configured such that when the temperature of the mesh filter is lower than a predetermined temperature, the electrical resistor is switched by the controller from an off-state to an on-state, during which the electrical energy is applied to the electrical resistor.

13. A method, comprising:

etching a substrate using a plasma generated in a plasma chamber at a plasma treating temperature so that a fluid flow which results from etching the substrate is obtained, the fluid flow including byproducts which are in a gaseous form in the plasma chamber at the plasma treating temperature;

directing the fluid flow to sequentially pass through a communication chamber and a mesh filter, the fluid flow in the communication chamber having a cooled down temperature lower than the plasma treating temperature, the byproducts being transformed into a solid form when passing through the communication chamber; and when the byproducts in the fluid flow pass through the mesh filter, transforming a phase of the byproducts from the solid form back to the gaseous form, so as to prevent the byproducts in the fluid flow from being collected by the mesh filter.

14. The method as claimed in claim 13, wherein the plasma is generated by preparing an etching gas and a hydrocarbon gas;

adjusting a concentration of the etching gas by controlling a proportion of the hydrocarbon gas so as to obtain a precursor gas including the etching gas and the hydrocarbon gas, ionizing the precursor gas.

15. The method as claimed in claim 13, wherein the mesh filter is heated to a predetermined temperature before etching the substrate using the plasma.

16. The method as claimed in claim 13, wherein transforming the phase of the byproducts from the solid form back to the gaseous form is performed by heating the mesh filter.

17. The method as claimed in claim 16, wherein the mesh filter is heated through a thermal conductor which is in direct contact with the mesh filter, and which transmits a heat energy from a heat generator to the mesh filter.

18. The method as claimed in claim 13, wherein the byproducts include hydrocarbon monomers, hydrocarbon polymers, halocarbon monomers, halocarbon polymers, or combinations thereof.

19. A method, comprising:

preparing a precursor gas including an etching gas and a carbon-containing gas;

ionizing the precursor gas to generate a plasma in a plasma chamber at a plasma treating temperature and to etch a substrate in the plasma chamber using the plasma, a fluid flow, resulting from etching the substrate, including byproducts which are formed from the precursor gas and which are in a gaseous form in the plasma chamber at the plasma treating temperature;

directing the fluid flow to sequentially pass through a communication chamber and a mesh filter, the fluid flow in the communication chamber having a cooled down temperature lower than the plasma treating temperature, the byproducts being transformed into a solid form when passing through the communication chamber; and when the byproducts in the fluid flow pass through the mesh filter, heating the byproducts in the fluid flow to transform a phase of the byproducts from the solid form back to the gaseous form, so as to prevent the byproducts in the fluid flow from being collected by the mesh filter.

20. The method as claimed in claim 19, wherein preparing the precursor gas includes preparing the etching gas and the hydrocarbon gas, and adjusting a concentration of the etching gas by controlling a proportion of the hydrocarbon gas, and the etching gas includes hydrogen fluoride, nitrogen fluoride, carbon fluoride, sulfur fluoride, or combinations thereof.

* * * * *